United States Patent [19]
Nichols et al.

[11] 3,946,573
[45] Mar. 30, 1976

[54] ELECTRICAL DIAGNOSTIC SYSTEM FOR REFRIGERATION APPARATUS

[75] Inventors: Duane C. Nichols; Samuel J. Pearson, both of Evansville, Ind.

[73] Assignee: Whirlpool Corporation, Benton Harbor, Mich.

[22] Filed: Aug. 22, 1974

[21] Appl. No.: 499,970

[52] U.S. Cl. .................. 62/126; 324/51; 340/214; 62/340
[51] Int. Cl.² ......................................... F25B 49/00
[58] Field of Search ........ 62/125, 126, 127; 324/51; 340/214

[56] References Cited
UNITED STATES PATENTS

| | | | |
|---|---|---|---|
| 2,385,525 | 9/1945 | Malldy | 62/126 |
| 3,590,373 | 6/1971 | Lake | 324/51 X |
| 3,736,765 | 6/1973 | O'Dell | 62/127 |
| 3,771,321 | 11/1973 | Maksy | 62/127 X |

*Primary Examiner*—William E. Wayner
*Attorney, Agent, or Firm*—Wegner, Stellman, McCord, Wiles & Wood

[57] ABSTRACT

A diagnostic system for use with refrigeration apparatus and the like for selectively indicating the operability condition of different electrical components thereof. The indicating apparatus is mounted to the refrigeration apparatus and includes a selector switch for selectively placing the apparatus in a normal operation mode or in a test mode. A lamp provided for normal illumination of the interior of the refrigeration apparatus cabinet is selectively utilized by the testing apparatus as an indicator of the operability condition of the selected component.

15 Claims, 2 Drawing Figures

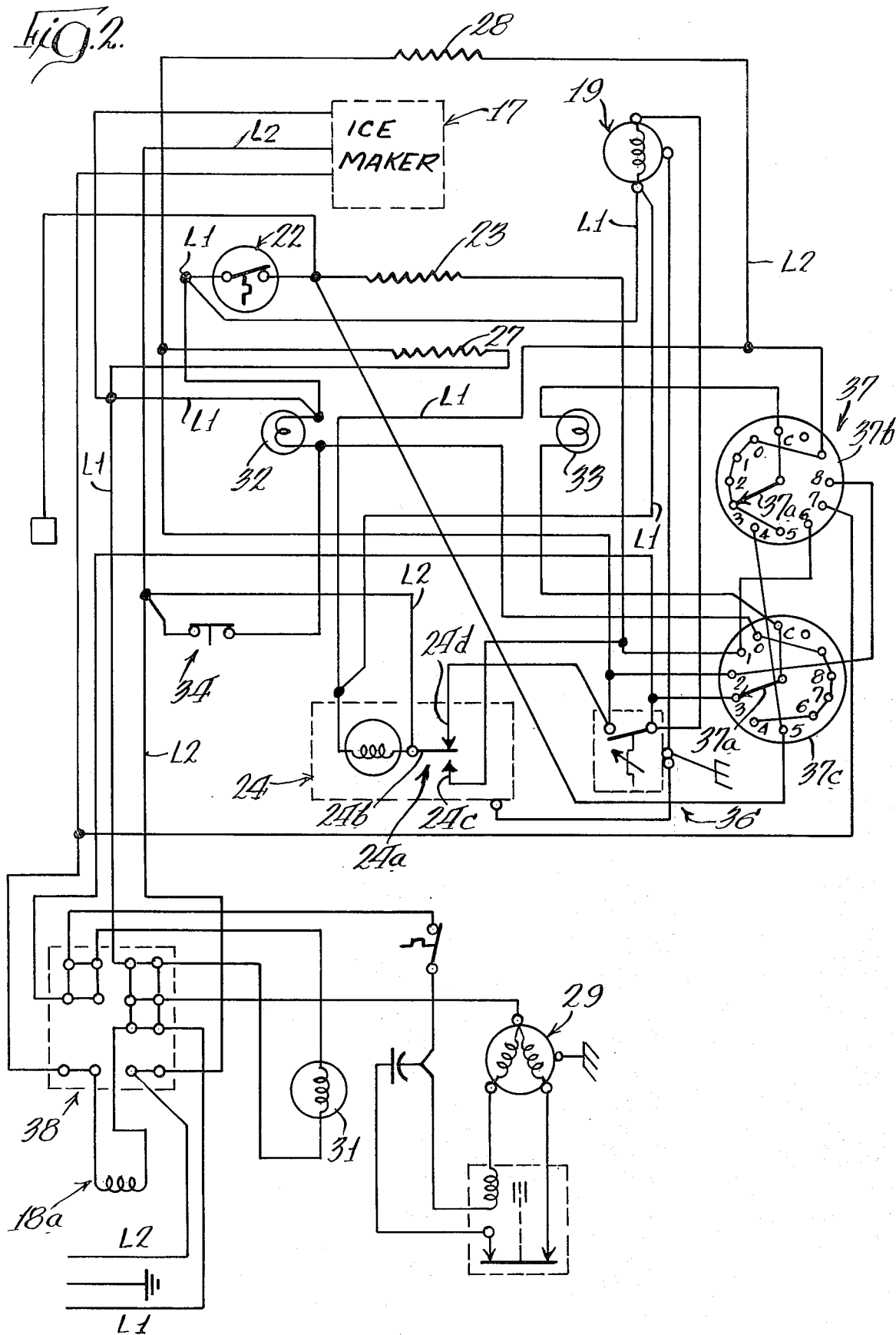

ELECTRICAL DIAGNOSTIC SYSTEM FOR REFRIGERATION APPARATUS

BACKGROUND OF THE INVENTION

1. Field of the Invention

This invention relates to refrigeration apparatus and in particular to means for selectively indicating the operability condition of electrical components of refrigeration apparatus.

2. Description of the Prior Art

In the diagnosis of electrical circuitry of refrigeration apparatus and the like, a serviceman utilizes conventional electrical test equipment, such as meters, indicating lamps, etc., by suitable isolation of the different electrical components and application of test voltages thereto. Substantial skill is necessary on the part of the serviceman to properly ascertain the operability condition of the different components.

To permit such servicing diagnosis in a facilitated manner, apparatus has been developed including a separable connector which is connected into the circuitry of the apparatus to permit testing of the operability condition of individual circuit components by means of a testing apparatus removably connected to the connector. Such apparatus enables the serviceman to more expeditiously make direct electrical connections to the isolated components of the apparatus, thereby facilitating the servicing of the apparatus.

Because of the relatively high cost of service in connection with appliances, such as refrigeration apparatuses and the like, it has been found desirable to permit the owner of the appliance to perform at least the diagnostic phase of the servicing so that the servicing may be effected by the owner or facilitated by a serviceman as a result of the diagnostic information obtained by the owner prior to requesting the service. The servicing of the apparatus by the owner in connection with a number of appliances may be facilitated by the use of plug-in components so that by means of suitable diagnosis, efficient and low cost servicing of the apparatus may be effected by the owner himself.

One example of means for indicating damage in the circuit of a refrigerator, or power failure in the service lines thereto, is illustrated in U.S. Pat. No. 2,385,525 of Graham S. McCloy. In the McCloy patent, the lamp which is normally energized when the door to the refrigerator food compartment is opened is connected in the apparatus so that a failure of the light to be de-energized during a defrosting cycle of the timer mechanism is used to indicate a failure in the clock mechanism or its associated circuitry. Thus, McCloy uses the lamp to indicate the defrosting of the refrigerator. In addition, McCloy provides a pair of additional lamps for illuminating a control panel. During a defrosting operation, energization of the normal cabinet illuminating lamp and one of the additional control indicating lamps is de-energized to indicate the defrosting operation. A signal lamp is provided in addition for indicating that electrical power is being provided to the refrigerator. The light from the signal lamp is dominated by the light from the control lamp and is preferably of a color different from the color of the control lamp.

U.S. Pat. No. 3,736,765 of George B. O'Dell, discloses the use of a connector means for checking and diagnosing the quality and operation of the components of a household appliance by means of test equipment connected to the appliance through the connector means. The connector means has a plurality of mating terminals which are separable to electrically isolate the electrical components of the appliance so that the components can be individually tested.

SUMMARY OF THE INVENTION

The present invention comprehends an improved diagnostic system for selectively indicating the operability condition of the electrical components of an appliance, such as a refrigeration apparatus. The condition indicating apparatus is provided integrally with the refrigeration apparatus so that a determination of the operability condition of the components may be effected at any time as by the user of the apparatus or by a serviceman in the servicing of the apparatus.

The indicating apparatus includes a selector switch permitting the refrigeration apparatus to function in the normal operational mode or selectively be rearranged so as to permit the testing of the individual electrical components. In the testing mode, the illuminating means of the refrigeration apparatus normally provided for illuminating the refrigerated space is utilized as an indicating means. Thus, the indicating apparatus is extremely simple and economical of construction utilizing a simple selector switch and modified circuitry in the apparatus while yet permitting the improved facilitated testing of the apparatus components.

The testing apparatus eliminates the need for special tools or equipment, thereby permitting the user to effect testing of the operability condition of the different electrical components without the need for expensive supplementary test equipment. Further, the test of the apparatus is facilitated by servicemen as the testing can be effected quickly and simply without the need for providing access to the electrical components to effect the testing procedure. As the testing circuitry is installed in the manufacturing facilities, correct connection of the testing apparatus in the testing mode is assured.

Among the electrical components which may be tested in an apparatus, such as a refrigeration apparatus, are the defrost timer switch, refrigerated space thermostat, defrost bimetallic thermostat, defrost heater, and mullion and stile heaters. Where the refrigeration apparatus includes an automatic ice maker, the water valve solenoid may further be tested by the improved testing apparatus of the invention.

BRIEF DESCRIPTION OF THE DRAWING

Other features and advantages of the invention will be apparent from the following description taken in connection with the accompanying drawing wherein:

FIG. 2 is a schematic wiring diagram illustrating the electrical circuitry of the diagnostic system.

DESCRIPTION OF THE PREFERRED EMBODIMENT

Figure 1:
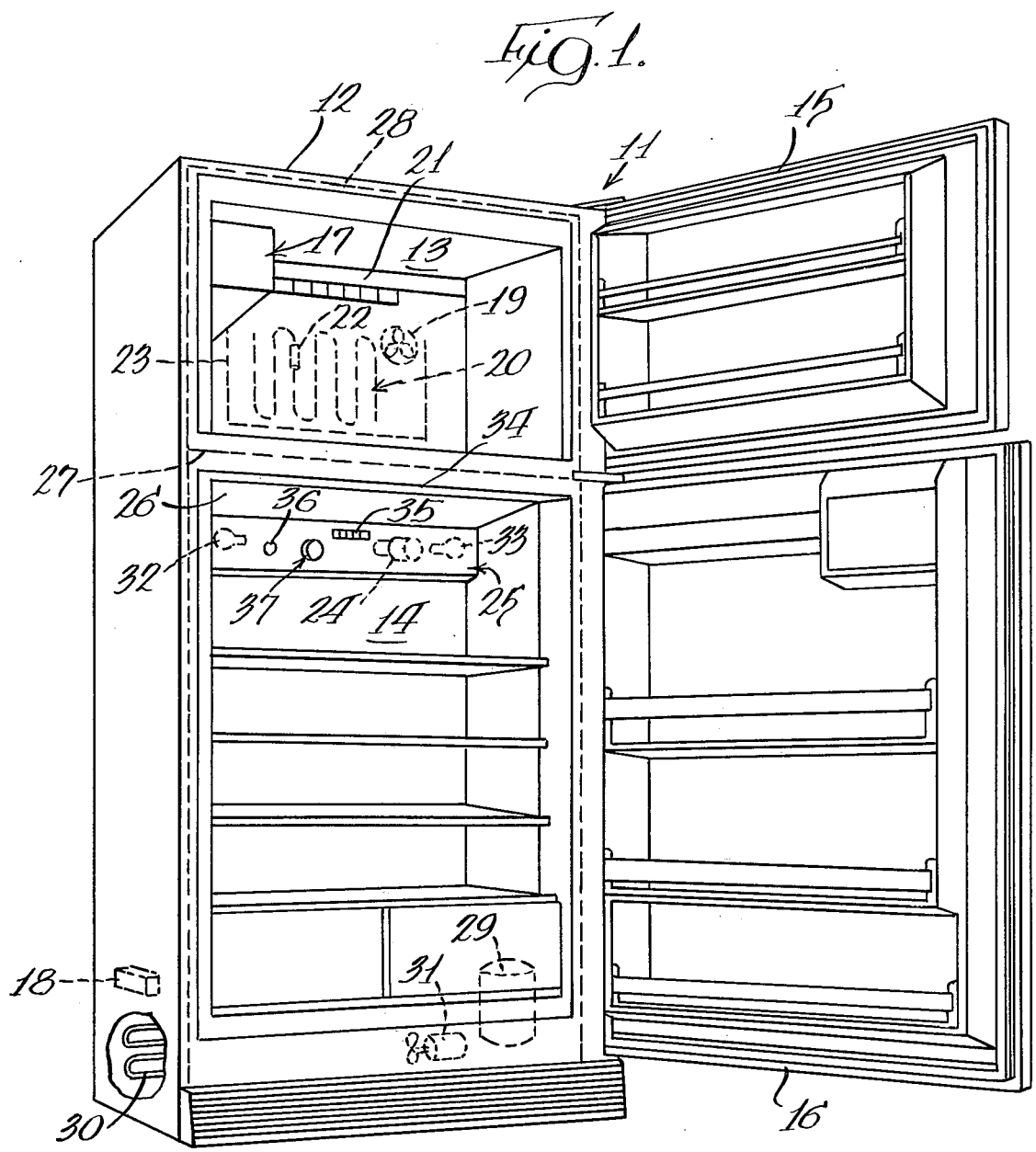
FIG. 1 is a perspective view of a refrigeration apparatus provided with a diagnostic system embodying the invention.

In the exemplary embodiment of the invention as disclosed in the drawing, a diagnostic system generally designated 10 is provided for use in an apparatus, such as an appliance, in selectively indicating the operability condition of electrical components thereof. In illustrating the invention, the diagnostic system is shown for indicating the condition of the components of a refrigeration apparatus generally designated 11 illustratively comprising a refrigerator-freezer apparatus. As shown in FIG. 1, the refrigerator-freezer apparatus 11 includes a cabinet 12 defining a freezer space 13 and an above-freezing refrigerator space 14 selectively closed by doors 15 and 16, respectively.

An automatic ice maker 17 may be provided in freezer space 13 to which water is automatically supplied through a suitable solenoid operated water valve 18 carried in a lower portion of the cabinet 12. In the illustrated embodiment, refrigeration of spaces 13 and 14 is effected by flowing air as by means of a fan 19 in heat exchange relationship with an evaporator 20 disposed in the rear wall 21 of cabinet 12 at the rear of space 13. A defrost bimetal control 22 is associated with evaporator 20 for controlling the defrosting operation which is effected in a conventional manner by a defrost heater 23 automatically controlled by a defrost timer 24 provided in a console 25 at the rear of refrigerator space 14 subjacent the mullion 26 separating spaces 13 and 14.

The mullion may be provided with an electric heater 27 and the stile may be provided with a stile heater 28.

The refrigeration circuit, including evaporator 20, further includes a conventional compressor 29 and condenser 30. A condenser fan 31 is provided for discharging heat from the condenser to atmosphere in the conventional manner.

Refrigerator space 14 is illuminated, upon opening of the door 16, by a pair of lamps 32 and 33 carried by console 25. A suitable switch 34 may be provided on mullion 26 for controlling the lights 32 and 33 as a function of the opening and closing of door 16. Console 25 may further include an air duct inlet 35 for delivering refrigerated air from freezer space 13 into refrigerator space 14. Operation of the refrigeration apparatus is automatically controlled by a thermostat 36 also carried by the console 25.

As discussed above, the present invention is concerned with the determination of the operability condition of the different electrical components of apparatus 11 and comprehends the provision of a diagnostic switch generally designated 37 carried by the console 25 for selective arrangement of the apparatus in a normal operation mode or in a diagnostic test mode. The selector switch is accessible at the rear of refrigerator space 14, as shown in FIG. 1, permitting facilitated selective indication of the operability condition of the apparatus components without the need for external test apparatus or access to the components themselves.

Referring now more specifically to the schematic wiring diagram of FIG. 2, selector switch 37 is arranged to permit the normal operation of the refrigeration apparatus with the switch set in the 0 position, i.e., with the wipers 37a of the two stages 37b and 37c connected to the 0 contact. Power may be provided in the apparatus from a conventional power supply including input leads L1 and L2. The apparatus may be provided with a conventional terminal block 38 through which the power supply leads are fed. Light switch 34 is connected from power supply lead L2 to contact 0 of selector switch stage 37c which, in turn, is connected to each of contacts 4, 6, 7 and 8 thereof. Switch 34 is further connected in series with lamp 32 to power supply lead L1 so that lamp 32 is illuminated whenever door 16 is in the open position of FIG. 1. Each of the electrical components, including the defrost timer switch 24a, the thermostat 36, the defrost bimetallic thermostat switch 22, the defrost heater 23, the automatic ice maker water valve solenoid 18a, and the mullion and stile heaters 27 and 28, is connected in the circuit in the normal manner to provide the normal functioning thereof in the automatic operation of the refrigeration apparatus.

To determine the operability condition of these different components, the user selectively repositions the selector switch 37 to any one of the eight additional positions wherein the corresponding component is isolated and placed in series with the lamp 33 to provide the desired diagnostic test thereof. Thus, with the switch wipers 37a in the first test position contacting contacts 1, the defrost timer switch 24a is isolated and placed in series with lamp 33. More specifically, in the first position, an electrical connection is made from power supply lead L2 through the moving contact 24b of switch 24a to the lower, fixed contact 24c thereof to contact 1 of selector switch stage 37c. Wiper 37a thereof is connected in series with lamp 33 to wiper 37a of front stage 37b which, through its connection to contact 1 thereof, is connected to power supply lead L1. In making this test, the defrost timer 24 is set to the "Defrost" position wherein switch 24a should be closed to fixed contact 24c so that if lamp 33 is not energized with the switch 37 in the first position, a failure of the defrost timer switch 24a is indicated.

When the defrost timer switch 24a is set to provide normal refrigeration operation of the apparatus, moving contact 24b closes with an upper, fixed contact 24d. This closing of the switch is tested by setting the selector switch 37 in the second position wherein the wipers 37a engage contacts 2. In this arrangement of the selector switch, the circuit through switch 24a is from power supply lead L2 to contact 24d to contact 2 of the rear stage 37c and through wiper 37a thereof and lamp 33 to the first stage wiper 37a and, thus, to power supply lead L1.

Thermostat switch 36 is tested by setting the selector switch 37 in the third position. As the thermostat switch functions only in the normal operation of the apparatus, the circuit is from power supply lead L2 through switch 24a which, in this mode, has moving contact 24b connected to fixed contact 24d. With the thermostat switch 36 closed, power is delivered to rear stage contact 3 and thence through the wiper 37a to lamp 33, and front stage wiper 37a to power supply lead L1.

Defrost bimetal switch 22 is tested with the selector switch in the fourth position. The circuit is from power supply lead L2 through light switch 34 to contact 4 of the rear stage 37c, through wiper 37a thereof and thence through lamp 33 and wiper 37a and contact 4 of switch stage 37b to bimetal switch 22 and thence to power supply lead L1.

In testing bimetal switch 22, it is necessary that the switch be subjected to a low temperature suitable for closing the switch. If the refrigerator has not been operating so as to provide this temperature, some external means of cooling must be provided.

The testing of defrost heater 23 utilizes alternative testing with the switch in either of position 5 or position 6. When the bimetal switch 22 is open, a check of heater 23 is effected by positioning the selector switch in position 5 wherein the circuit is from power supply lead L2 through switch 24a with the switch in the Defrost arrangement wherein moving contact 24b is closed to fixed contact 24c, and to one side of the resistor 23. The other side of the heater resistor is connected to contact 5 of switch stage 37c and wiper 37a thereof in contact therewith to lamp 33 and wiper 37a to power supply lead L1.

In the event that bimetallic switch 22 is closed, the operability condition of heater resistor 23 may be tested by positioning the selector switch 37 in the sixth position wherein the circuit through the heater resistor is from power supply lead L2 through light switch 34 to contact 6 of selector switch stage 37c, wiper 37a to lamp 33 and wiper 37a of the front stage 37b to fixed contact 6 thereof and thence through resistor 23 and the closed bimetallic switch 22 to power supply lead L1.

The water valve solenoid 18a is tested with the selector switch in position No. 7. In this position, power is supplied from power supply lead L1 through the solenoid 18a to contact 7 of front stage 37b, through wiper 37a and lamp 33 to wiper 37a of rear stage 37c, and from contact 7 of stage 37c to light switch 34 and power supply lead L1. Solenoid 18a is of relatively high impedance and, thus, in this test, lamp 33 burns relatively dimly whereas in each of the other tests, the indication that the circuit component is good comprises a bright illumination of the lamp.

To test the mullion and stile heaters 27 and 28, switch 37 is set in the eighth position. The circuit thus established is from power supply lead L2, light switch 34, contact 8 of the rear stage 37c through wiper 37a to lamp 33, through wiper 37a of front stage 37b to contact 8 thereof and through heaters 27 and 28 to power supply lead L1. As the resistance of the heaters is relatively high notwithstanding the parallel connection thereof, lamp 33 will glow relatively dimly in indicating continuity through the two heaters and very dimly if one of the heaters is open-circuited. If both are open-circuited, obviously, the lamp will not be energized.

Thus, by simple manipulation of the selector switch 37, normal operation of the refrigeration apparatus may be obtained or alternatively, any one of the connected electrical components may be tested simply and quickly without requiring any special equipment, instruments, or the like. No electrical test connections to the apparatus need be made as all are integrally provided therein at the time of manufacture. The location of the selector switch 37 is closely adjacent the indicating lamp 33 so that ready reference to the lamp may be made while concurrently operating the selector switch to the desired selective positions.

The following electrical diagnosis chart may thusly be utilized in connection with the illustrated embodiment. As will be obvious to those skilled in the art, other appliances and electrical components thereof may be provided with similar selector switch diagnostic system means within the scope of the invention.

ELECTRICAL DIAGNOSIS CHART
TEST SETTING

| PROBLEM | PROBABLE CAUSE | TEST SWITCH POS. | DEFROST TIMER POSITION | THERMOSTAT POSITION | COMPONENT O.K. IF: |
|---|---|---|---|---|---|
| HIGH REF. AND FRZR. TEMPS. OR NO COOLING | DEFROST TIMER SWITCH | 1 | DEFROST | ON OR OFF | BOTH BRIGHT LIGHT AND |
|  |  | 2 | REFRIGERATE | ON OR OFF | BRIGHT LIGHT |
|  | THERMOSTAT | 3 | REFRIGERATE | ON | BRIGHT LIGHT |
|  | DEFROST BIMETAL (See Note 4) | 4 | EITHER | ON OR OFF | BRIGHT LIGHT |
|  | DEFROST HEATER | 5 | DEFROST | ON OR OFF | EITHER BRIGHT LIGHT OR |
|  |  | 6 | REFRIGERATE | ON OR OFF | BRIGHT LIGHT |
| NO ICE | I.M. WATER VALVE | 7 | EITHER | ON OR OFF | DIM LIGHT |
| CABINET EXTERIOR SWEATING | MULLION & STILE HEATERS | 8 | DEFROST | OFF | DIM LIGHT |
| HIGH REFR. & FRZR. TEMPS. OR NO COOLING | INTERIOR FAN | 0 | REFRIGERATE | ON | INTERIOR AIR FLOW |
|  | EXTERIOR FAN | 0 | REFRIGERATE | ON | EXTERIOR AIR FLOW |
|  | COMPRESSOR | 0 | REFRIGERATE | ON | INTERIOR COOLING |

Notes:
(1) OPERATE THE DOOR SWITCH PRIOR TO START OF TESTING TO INSURE RIGHT SIDE LIGHT IS OPERATING — ON AND OFF.
(2) DEFROST TIMER MUST BE CHECKED FIRST TO INSURE THAT A DEFECTIVE TIMER WILL NOT AFFECT OTHER RESULTS.
(3) RETURN TEST SWITCH TO NON-NUMBERED POSITION WHEN CHECKS ARE COMPLETED.
(4) DEFROST BIMETAL MUST BE COLD TO CHECK OPERATION: IF NECESSARY, COOL BIMETAL WITH FREON.

The foregoing disclosure of specific embodiments is illustrative of the broad inventive concepts comprehended by the invention.

Having described the invention, the embodiments of the invention in which an exclusive property of privilege is claimed are defined as follows:

1. In a refrigeration apparatus having a plurality of electrical components, apparatus for selectively indicating the operability condition of the components, comprising testing control means carried by said apparatus including selector switch means and circuit means interconnecting said switch means and one of said electrical components to cause said one component to define an indicator means for selectively (a) causing normal operation of the apparatus, or (b) separately connecting said components to said indicator means for indicating the operability condition of the different components.

2. The refrigeration apparatus of claim 1 wherein said indicator means comprises means for illuminating the refrigeration apparatus in said normal operation of the apparatus.

3. The refrigeration apparatus of claim 1 wherein said refrigeration apparatus defines a cabinet selectively closed by a door, and said indicator means comprises means for illuminating the interior of the cabinet when said door is disposed in an open position.

4. The refrigeration apparatus of claim 1 wherein said one of said electrical components comprises a switch for controlling a defrost operation of said refrigeration apparatus.

5. The refrigeration apparatus of claim 1 wherein said refrigeration apparatus includes a defrost timer and one of said electrical components comprises a defrost switch arranged to be closed by the timer in the defrost operation of the refrigeration apparatus.

6. The refrigeration apparatus of claim 1 wherein said refrigeration apparatus includes a defrost timer and one of said electrical components comprises a refrigeration switch arranged to be closed by the timer in the refrigeration operation of the refrigeration apparatus.

7. The refrigeration apparatus of claim 1 wherein one of said electrical components comprises a thermostat responsive to the temperature condition of the apparatus for controlling refrigeration operation of the apparatus.

8. The refrigeration apparatus of claim 1 wherein one of said components comprises a bimetallic switch responsive to a temperature condition of the apparatus for controlling a defrost operation of the apparatus.

9. The refrigeration apparatus of claim 1 wherein one of said components comprises a defrost heater in series with a bimetallic control switch and said testing control means includes means for connecting said defrost heater to different portions of the selector switch for selective testing of the defrost heater operability condition (a) with the bimetallic control switch closed, and (b) with the bimetallic control switch open.

10. The refrigeration apparatus of claim 1 wherein said apparatus includes an ice maker mechanism and one of said components comprises a solenoid controlling a water supply valve for selective delivery of water to said ice maker mechanism.

11. The refrigeration apparatus of claim 1 wherein said apparatus includes a cabinet and one of said components comprises an electric heater for selectively heating a portion of the cabinet.

12. In a refrigeration apparatus having a plurality of electrical components, and a cabinet defining a space to be refrigerated, apparatus for selectively indicating the operability condition of the components, comprising:
  lamp means mounted within said cabinet for illuminating said space; and
  a testing control means carried by said cabinet including selector switch means and circuit means interconnecting said switch means and said lamp means for selectively
  a. causing normal cabinet illuminating operation of the lamp means, or
  b. separately connecting said components to said lamp means whereby said lamp means may be utilized for indicating the operability condition of the different components.

13. The refrigeration apparatus of claim 12 wherein said selector switch is mounted to said cabinet adjacent said lamp means.

14. The refrigeration apparatus of claim 12 including a plurality of lamps illuminating said space, and said lamp means comprises a single one of said lamps.

15. The refrigeration apparatus of claim 12 wherein said refrigeration apparatus further includes additional lamp means for illuminating said space irrespective of the positioning of said selector switch.

* * * * *